United States Patent
Chen et al.

(10) Patent No.: US 6,403,967 B1
(45) Date of Patent: Jun. 11, 2002

(54) MAGNET SYSTEM FOR AN ION BEAM IMPLANTATION SYSTEM USING HIGH PERVEANCE BEAMS

(75) Inventors: Jiong Chen, San Jose; Jinliang Chen, Cupertino; Eric Henry Jon Antonissen, Sunnyvale, all of CA (US)

(73) Assignee: Advanced Ion Beam Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/419,448

(22) Filed: Oct. 15, 1999

(51) Int. Cl.$^7$ .............................................. H01J 37/147

(52) U.S. Cl. .................. 250/396 ML; 250/281; 250/492.3; 250/492.2

(58) Field of Search .................. 250/396 ML, 281, 250/492.3, 492.2

(56) References Cited

U.S. PATENT DOCUMENTS

| | | | |
|---|---|---|---|
| 4,458,151 A | | 7/1984 | Koike et al. |
| 5,311,028 A | * | 5/1994 | Glavish .................. 250/492.21 |
| 5,554,857 A | | 9/1996 | Benveniste |

FOREIGN PATENT DOCUMENTS

JP      61-171047-a    * 8/1986 .......... 250/396 ML

* cited by examiner

*Primary Examiner*—Jack Berman
*Assistant Examiner*—Kalimah Fernandez
(74) *Attorney, Agent, or Firm*—Pennie & Edmonds LLP (57) ABSTRACT

An apparatus for ion implantation using high perveance beams is disclosed. The apparatus includes a dipole magnet apparatus that provides an adjustment to a cross-beam magnetic dipole field in an ion implantation system. Introduction and control of the magnetic dipole field gradient in a low energy implantation system as disclosed herein gives a significant improvement to the magnet's acceptance and beam focusing which largely defines the effective transported beam current. The apparatus involves the use of ferromagnetic yokes of a prescribed shape and a portion of a secondary magnet coil following along the outside radius of a set of primary dipole magnet coils which define and delineate the primary magnetic field area and beam path. The current return path for the secondary magnet coil is via another portion of the secondary magnet coil that follows a path such that the field generated by the return path secondary magnet coil is orthogonal to the primary magnetic field. The resulting magnetic field across the beam cross-section has a sloping shape with relative maxima and minima near the transverse beamline boundary. The action of the magnetic field distribution on the ion beam acts to compensate the space-charge dispersion of high perveance beams.

20 Claims, 8 Drawing Sheets

MAGNET SYSTEM FOR AN ION BEAM IMPLANTATION SYSTEM USING HIGH PERVEANCE BEAMS

FIELD OF THE INVENTION

The present invention relates generally to ion beam transport and mass analysis in the presence of a magnetic field. More particularly, the invention relates to an apparatus for selecting ion beams in ion implantation systems using high perveance beams.

BACKGROUND OF THE INVENTION

Ion implantation has been widely used as one of the major process steps for fabricating integrated circuits. Ion implantation is a process used to selectively implant dopants (elemental or molecular species) into various substrate materials such as semiconductors and metals to obtain useful physical properties and devices. As integrated circuits are miniaturized, ion implantation systems with relatively low energy (<5 KeV) and high current (>5 mA) are now in demand in order to accommodate specifications of the integrated circuits. However, low energy and high current ion beam transport suffers from effects of space-charge induced divergence (or "blow-up"). As a result, ion beam current is excessively lost to apertures and walls of vacuum chambers of the ion implantation system.

Low energy and high current ion beams are generally known as high perveance beams. The perveance is expressed as follows:

$$P = I(M/m_e)^{1/2} U^{-3/2}$$

where P is the perveance, I is the ion beam current, M is the ion mass, $m_e$ is the mass of the electron, and U is the beam acceleration potential. To effectively transport the high perveance beam, it is necessary to use magnets with a large acceptance. Magnet acceptance is a function of the product of beam cross section and beam envelope angle. It is known that the acceptance of conventional sector magnets may be significantly limited by fringe magnetic fields near the inner and outer arcuate edges of the magnets. The traditional sector magnet optimization can be found in H. F. Glavish, Magnet Optics For Beam Transport, Nuclear Instruments and Methods, 43–55 (1981).

There are several attempts to improve magnet acceptance in the prior art. In "A Separate Function Magnet Lattice for a Very High Energy Synchrotron," Proceeding of International Conference on Magnet Technology, $2^{nd}$, edited by H. Hadley, 768, Oxford, England,(1967), Danby et al. use pole rotations and curvature of the magnet pole at the entrance and exit positions. Window frame magnets are also used extensively to minimize fringe field effects.

The space-charge divergence inherent in low energy and high current beams can also be offset somewhat by magnetic focusing through optimizing the system's beam optics and increasing the magnet acceptance. Contoured yokes are used to modify the distribution of the magnetic field to provide magnetic focusing in particle accelerator systems (cf. Livingston et al., Particle Accelerators, McGraw Hill Book Company, 246–56 (1962)). As disclosed in U.S. Pat. No. 4,740,758 to Ries (1988), corrector coils are also used to provide dynamic adjustment to the magnetic field in high energy particle accelerators to obtain desired magnetic focusing. Such magnetic focusing in accelerator systems involves the introduction of higher order magnetic moments. typically quadruple and sextuple components. into the field region. Analogous approaches have also been used to compensate higher order moments to obtain highly homogeneous dipole fields for use in nuclear magnetic resonance systems as depicted in U.S. Pat. No. 4,509,030 to Vennilyea (1985). Dynamic focusing of low energy ion beams with focusing magnetic quadrupole fields generated by a plurality of quadrupole coils has recently been disclosed in U.S. Pat. No. 5,736,743 to Benveniste (1996) in the field of ion implantation.

Despite all these efforts on trying to deliver a reliable production-worthy low energy and high current implantation system to market, manufacturers have thus far achieved only modest success, usually at the cost of sacrificing beam quality (e.g., high contamination and poor reliability) for beam quantity (e.g., ion beam current).

SUMMARY OF INVENTION

The invention disclosed herein provides a significant improvement and simplification of the prior art by combining dipole magnet coils with contour yokes and secondary magnet coils to generate a gradient in the dipole field that enhances beam transport. The invention is capable of achieving superior beam currents without sacrificing beam quality while simultaneously reducing the complexity and the cost of production and operation.

The magnet system used in an ion beam implantation system according to the invention comprises a ferromagnetic assembly that defines a magnetic field region therein and has an entrance and an exit for an ion beam that passes through the magnetic field region. At least one primary magnet coil is mounted inside the assembly for generating a first magnetic field in a first direction at the magnetic field region. At least one secondary magnet coil is mounted inside the assembly for generating a second magnetic field in a second direction at the magnetic field region such that a resulting magnetic field has a gradient along one direction at the magnetic field region that enhances ion beam transport.

The assembly has upper and lower mirror-image yokes. Each yoke has a first inner sidewall, a second inner sidewall opposed to and outward of the first inner sidewall, and an inwardly facing contour pole face located between the first and second inner sidewalls. The pole faces of the upper and lower yokes oppose each other. First and second primary magnet coils are mounted on the inner sidewalls of the upper and lower yokes, respectively, such that the direction of the magnetic field generated by these coils is across, preferably perpendicular to, the two pole faces of the upper and lower yokes. First and second secondary magnet coils are mounted in the upper and lower yokes with their respective first portions on the pole faces of the upper and lower yokes. The magnetic field generated by the first portions of the secondary magnet coils is across the first and second inner sidewalls. The first and second secondary magnet coils have second portions that are mounted on the first and second primary magnet coils. As a result, the resulting magnetic field has a gradient along the direction of the first and second inner sidewalls.

Each pole face has a convex shape protruding towards the magnetic field region. Preferably, the convex shape has a groove at the center thereof and the first and second secondary magnet coils have their respective first portions mounted in such grooves. In one embodiment, the first and second secondary magnet coils have their respective second portions mounted on the surface of the portions the first and second primary magnet coils located on the second inner sidewalls.

In a second embodiment of the invention, the magnet system has the configuration as that in the first embodiment except that the first and second secondary magnet coils have their respective second portions mounted on the surface of the portions of the first and second primary magnet coils located on the first inner sidewalls.

In a third embodiment of the magnet system of the invention, four secondary magnet coils are used and each pole face has two grooves adjacent to each other. Each of the secondary magnet coils has a first portion mounted in one of the grooves and a second portion mounted on the surface of the portion of the primary magnet coil located on the nearer inner sidewalls.

The yokes are made of ferromagnetic materials. The pole face may comprise interchangeable pieces for adjusting the shape and strength of the magnetic field in the magnetic field region.

BRIEF DESCRIPTION OF THE DRAWINGS

These and other objects, features and elements of the present invention will be better understood from the following detailed description of preferred embodiments of the invention in which.

DETAILED DESCRIPTION OF PREFERRED EMBODIMENTS

Figure 1:
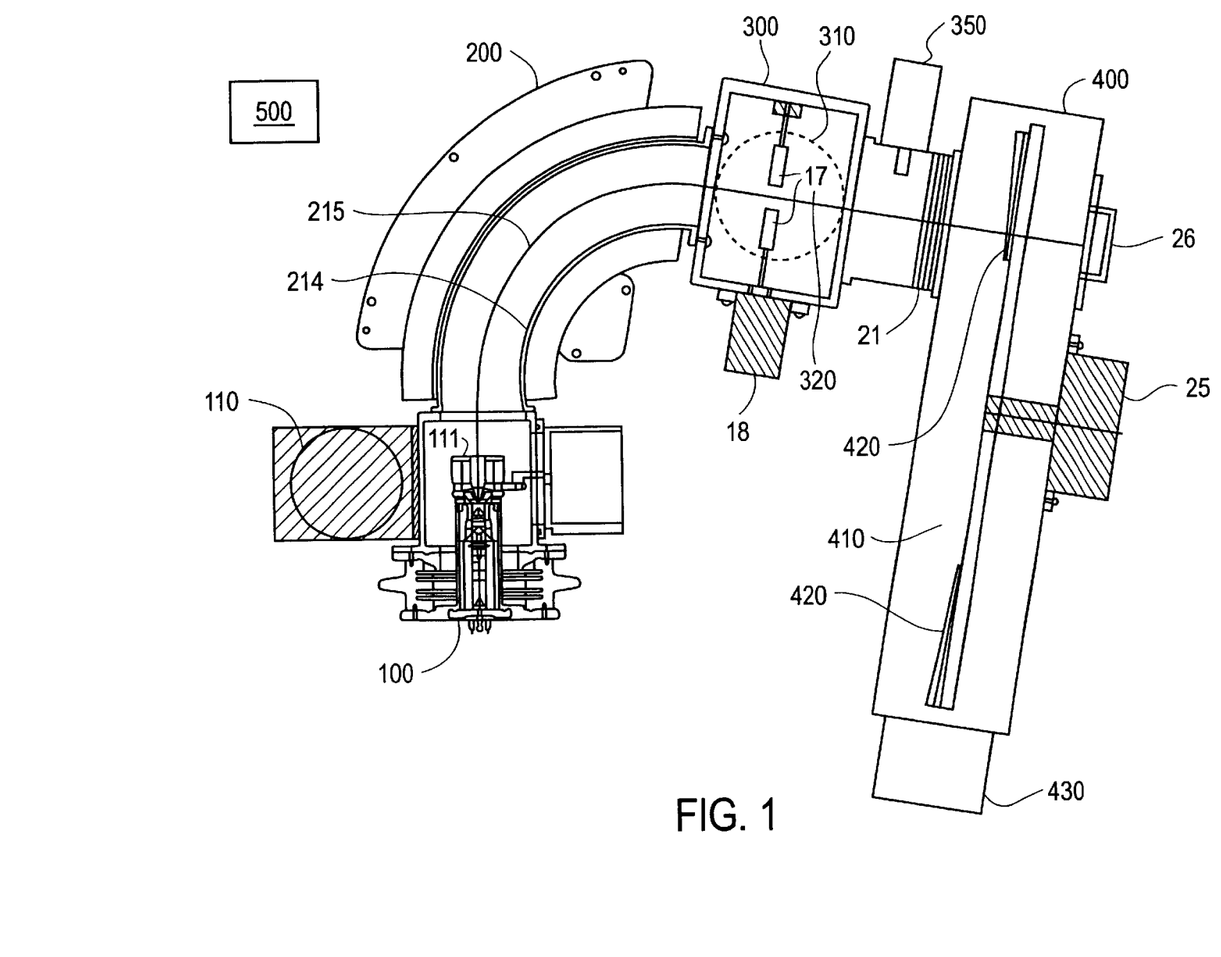
FIG. 1 is a schematic illustration of an ion implantation system in which the magnet system of the invention is used.

Referring to the drawings, FIG. 1 shows an overview of an ion beam implantation system in which the magnet system of the invention is used. The ion beam implantation system comprises an ion beam source 100, a magnet system 200, a resolving chamber 300, an electron charge control system 350, and an endstation chamber 400 in which a rotating disk 410 holds a plurality of work pieces 420 for batch processing. A control system 500 monitors and regulates each of these system components to achieve desired properties of beam energy, beam current, and implant dosage. A vacuum system having vacuum pumps 110, 310 and 430 are used to evacuate respectively the ion beam source 100, the magnet system 200 and the endstation chamber 400.

Ions are usually generated in a hot cathode discharge ion source. The ions are then extracted to form ion beams. The ion beams are focused and accelerated by various means within the ion beam system. Descriptions of these extracting, focusing and accelerating means are omitted herein because they are known to one of ordinary skill in the art. When the ion beams emanate from the ion source, they contain various elemental and molecular ions. The ion beams are directed to the entrance of the magnet system which selects desired ions. The typical desired ions for application in semiconductor fabrication include boron, phosphorous, and arsenic. Trajectory 215 in FIG. 1 represents an arcuate path of an ion beam in the magnet system with its radius determined by a combination of the magnitude of a magnet current and the energy, mass, and charge-state of the ions. Only constituents of the ion beams with correct charge to mass ratio are able to reach the exit aperture of the magnet system within the specified resolution.

Upon exiting the magnet system, the selected ions travel through the resolving apertures 320 of the resolving chamber. The magnet system is designed such that its focal point position nominally coincides with the location of the resolving apertures to provide additional mass resolution and beam collimation. The ion beams used for treating semiconductor wafers with ion implantation are typically positively charged. To avoid deleterious effects of excessive charge accumulation on the wafers, a source of low energy electrons is needed for charge compensation. Electron charge control system 350 is provided as the source of low energy electrons and located before the endstation where the work pieces are located. The resulting mass filtered and charge compensated ion beam is then directed onto the work piece, typically a silicon or gallium arsenide wafer, to achieve a specified dopant concentration.

Figure 2:
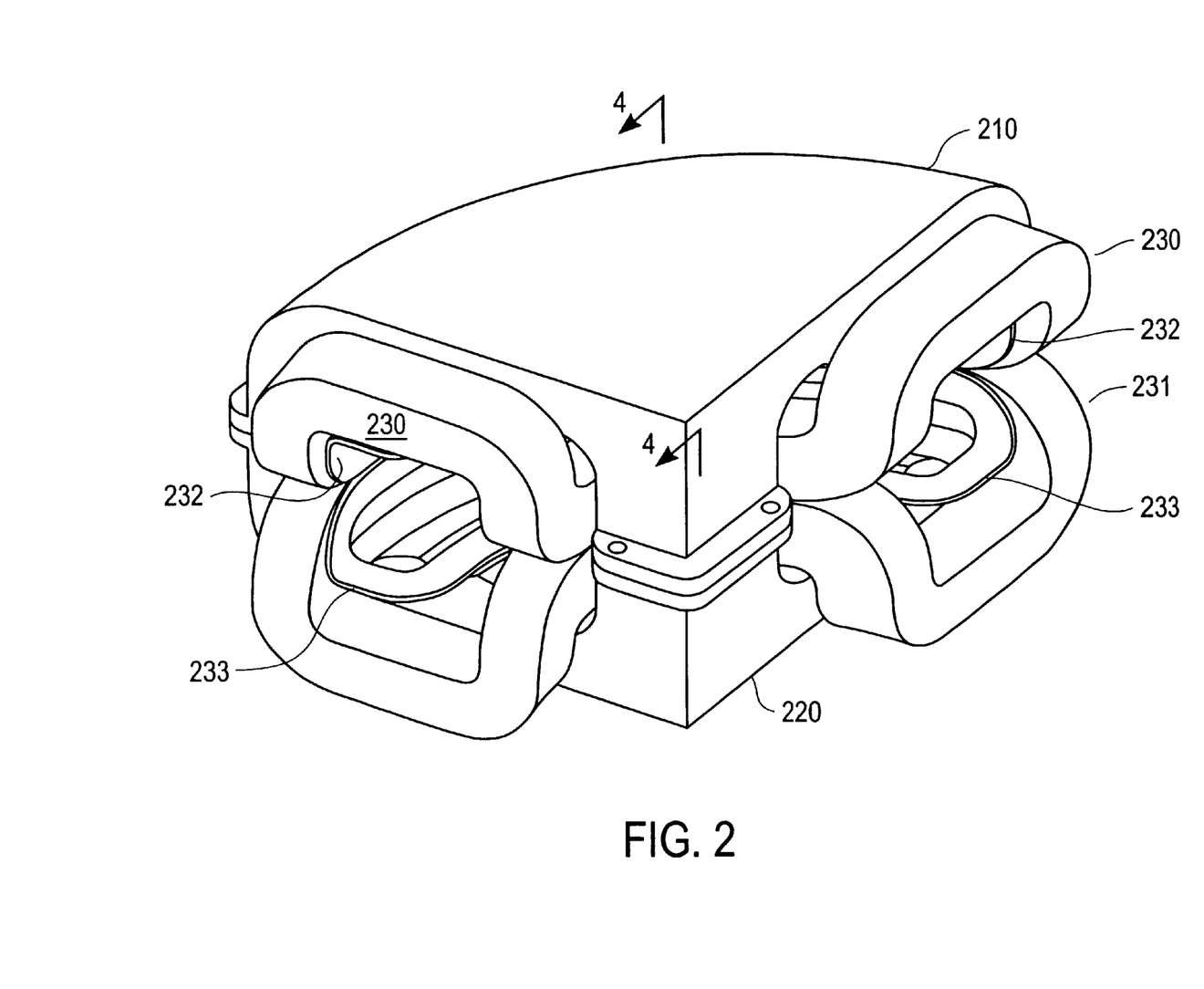
FIG. 2 is a perspective view of the magnet system of a first embodiment of the invention showing primary dipole magnet coils and secondary magnet coils mounted in upper and lower yokes respectively.
Figure 3:
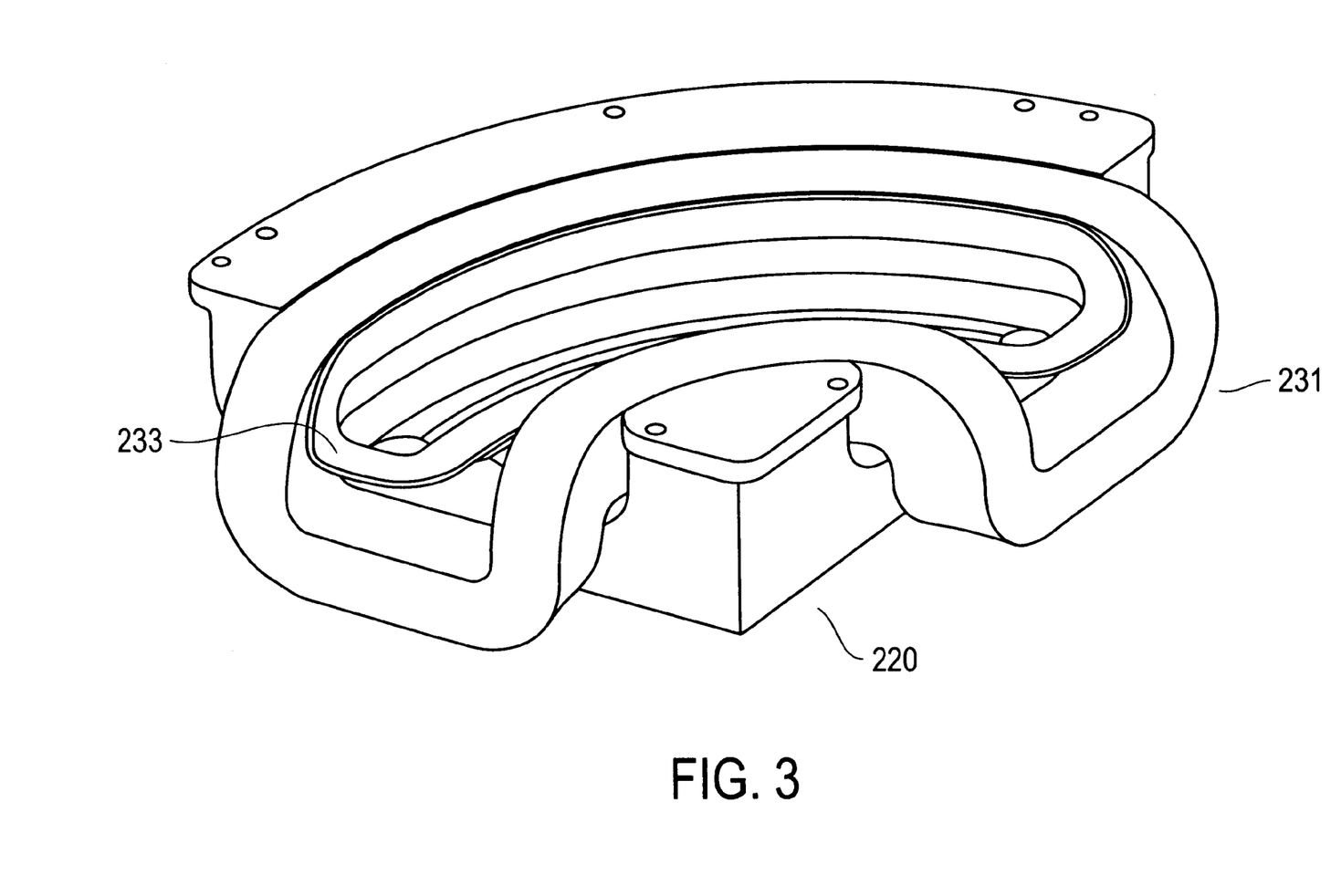
FIG. 3 is a perspective view of the lower yoke of the embodiment of FIG. 2.
Figure 4:
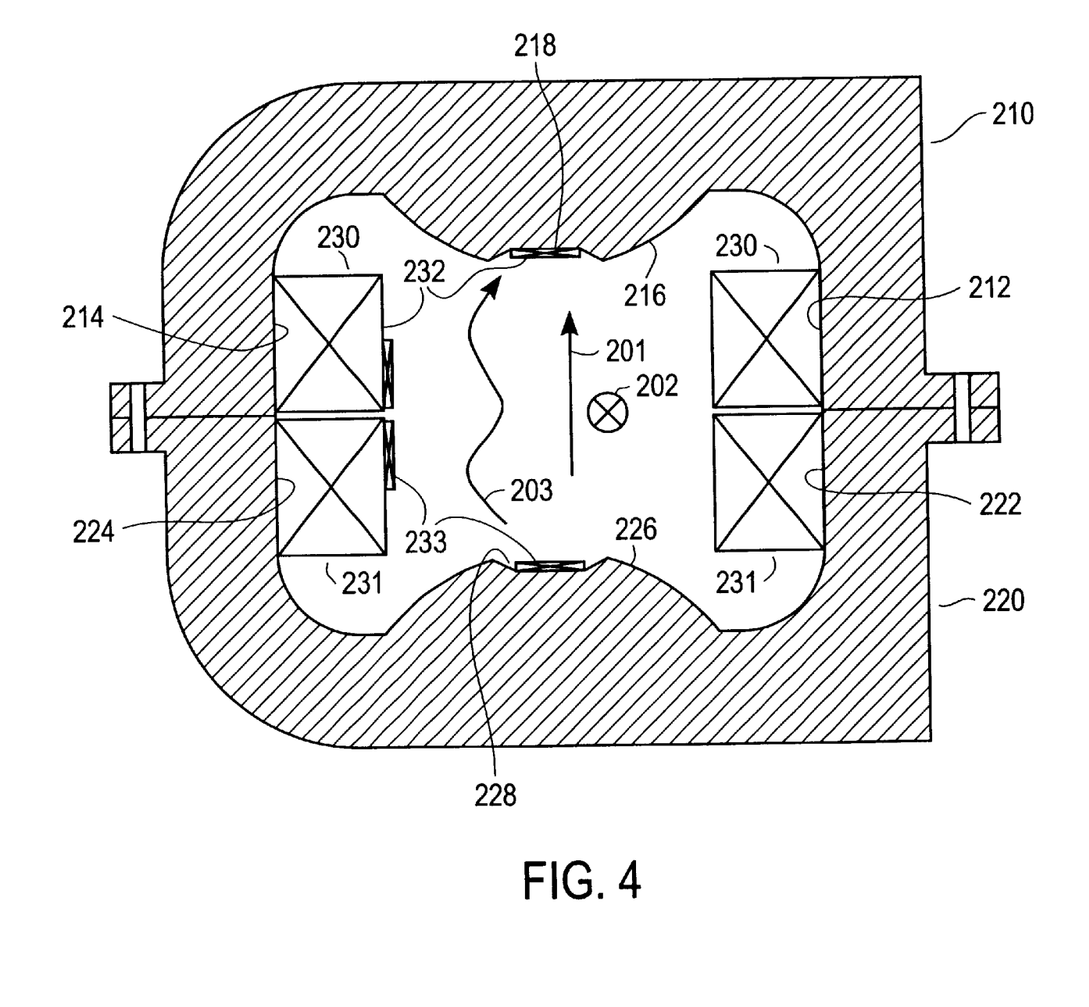
FIG. 4 is a cross-sectional view of the magnet system of the first embodiment taken along line 4—4 of FIG. 2.
Figure 9:
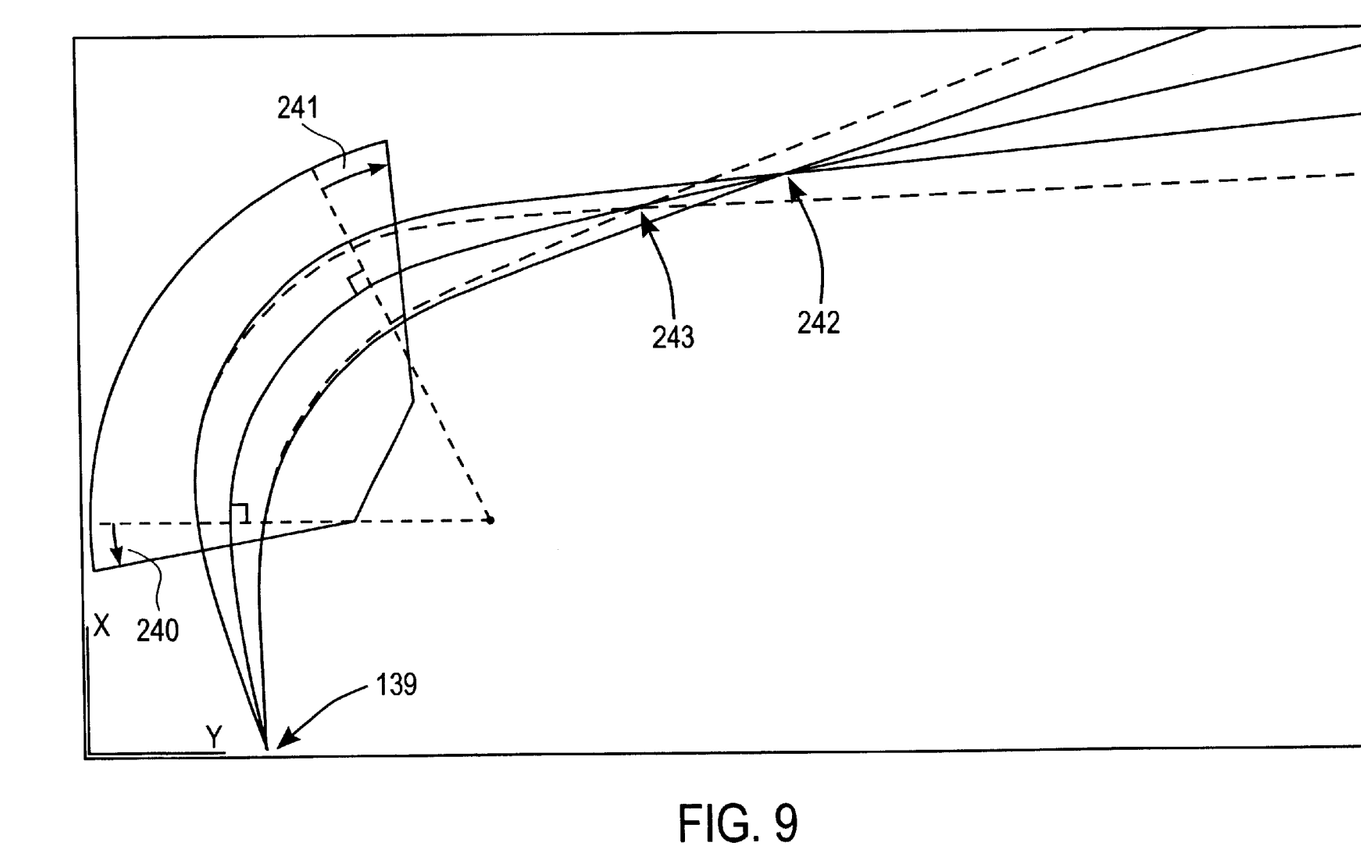
FIG. 9 is a plan view illustrating beam paths and beam focusing points for two different magnet system configurations.

The magnet system of a first embodiment of the invention is shown in the perspective views of FIGS. 2 and 3 and the cross-sectional view of FIG. 4. The magnet system comprises upper and lower yokes 210 and 220 which face other. Each of the yokes is made of a ferromagnetic material and has an arcuate shape sector extending along an arc of approximately 50 to 150 degrees from the entrance to the exit. Each yoke also has pole rotations 240, 241 at both ends of the arcuate shape sector as shown in FIG. 9. The pole rotations 240, 241 preferably have −10 and +20 degrees. The yokes define a magnetic region therein, through which the ion beams travel. The magnet system further comprises upper and lower primary dipole magnet coils 230 and 231 and upper and lower secondary magnet coils 232 and 233 mounted inside the upper and lower yokes respectively to generate a magnetic field.

As best shown in FIG. 4, which is a cross-section taken along line 4—4 of FIG. 2, each yoke has a first inner sidewall 212, 222 with a smaller radius of curvature, a second inner sidewall 214, 224 with a larger radius of curvature opposed to and outward of the first inner sidewall, and an inwardly facing contour pole face 216, 226 located between the first and second inner sidewalls. Pole faces 216, 226 of the upper and lower yokes oppose each other.

The upper and lower yokes of the magnet system are mirror images of each other. FIG. 3 is a perspective view of the lower yoke 220 with the primary dipole magnet coil 231 and the secondary magnet coil 233 mounted therein. Primary dipole magnet 231 coil is generally saddle shaped and mounted on both the first and second inner sidewalls of the yoke that extend through the complete arcuate sector of the magnet system. At the entrance and the exit of the magnet system, the primary dipole magnet coil is shaped to form a saddle or window configuration. When being energized, the primary dipole magnet coils in the yokes generate a magnetic field. The magnetic field has a direction across the pole faces, which is preferably perpendicular to the plane of FIG.

1. The manner of flowing a magnet current in the primary dipole magnet coils determines the direction of the magnetic field of being going into or coming out of the plane of FIG. 1. Referring to FIG. 4, the direction of the magnetic field, for example, is represented by an arrow 201. In this example, The ion beam travels through the plane of FIG. 4 represented by symbol 202. Advantageously, the primary dipole magnet coils are constructed with layers of copper tubings that serve a dual purpose of providing an electrical conduit for the magnet current and a conduit for coolant.

Secondary magnet coil 233 is configured in such a manner that a first portion thereof is mounted on pole face 226, and a second portion of the secondary magnet coil is rotated by 90 degrees relative to the first portion of the coil and runs along the inside surface of the portion of the primary dipole magnet coil 231 that is mounted on the second inner sidewall 224 having the larger radius of curvature. The magnetic field generated by the first portion of the secondary magnet coil is primarily in a radial direction perpendicular to the curve of the arcuate sector of the yoke. The magnetic field generated by the second portion is in the same/opposite direction to that generated by the primary dipole magnet coil. The resulting magnetic field by the secondary coils has a profile 203 in FIG. 4 in the magnetic field region.

The pole faces 216, 226 of the upper and lower yokes are made to have a contour shape to introduce higher order moments into the magnetic field region located in the space between the pole faces and the primary dipole magnet coils. In this embodiment, each pole face preferably has a convex shape protruding towards the magnetic field region. Further, a groove 218, 228 is preferably formed at the center of each convex pole face and the secondary magnet coil is inset into the groove. The outside thickness of the yokes is made sufficiently large so that magnetic saturation does not pose serious limitations on the magnet system at a full induction current.

The pole face of the magnet system of the invention may have different shapes, and the secondary magnet coils may be placed at different locations.

Figure 5:
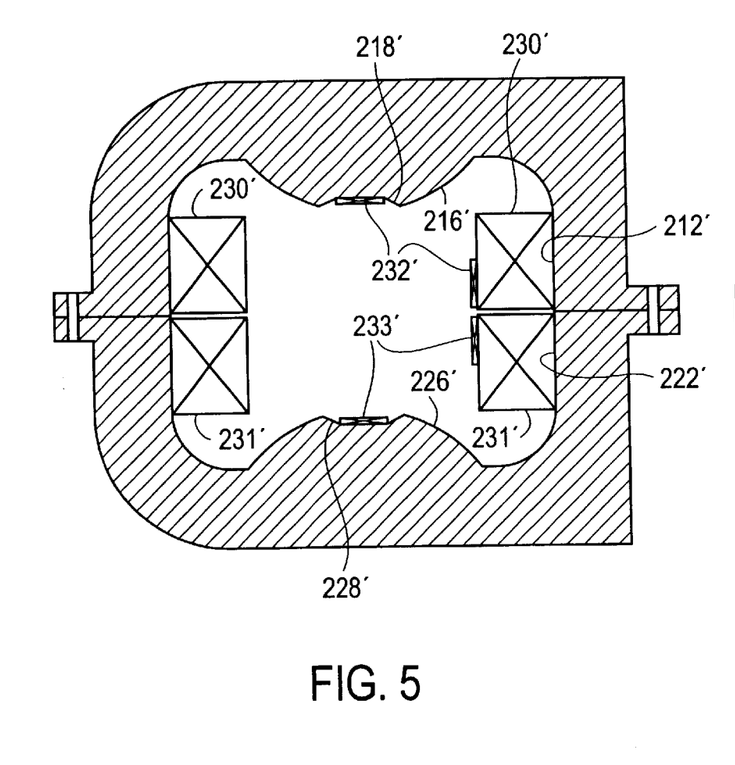
FIG. 5 is a cross-sectional view of the magnet system of a second embodiment of the invention.

FIG. 5 is a cross section view of the magnet system of a second embodiment of the invention taken along a radial direction thereof. Like that in the first embodiment, the pole faces 216', 226' in this embodiment preferably have a convex shape protruding towards the magnetic field region with a groove 218', 228' is formed at the center of the pole face. The secondary magnet coil is configured in such a manner that a first portion of the secondary magnet coil 232', 233' is mounted on the pole face, preferably in the groove of the convex shaped pole face, and a second portion of the secondary magnet coil is mounted on the surface of the portion of the primary dipole magnet coil 230', 231' that is positioned on the first inner sidewall 212', 222' with a smaller radius of curvature.

Figure 6:
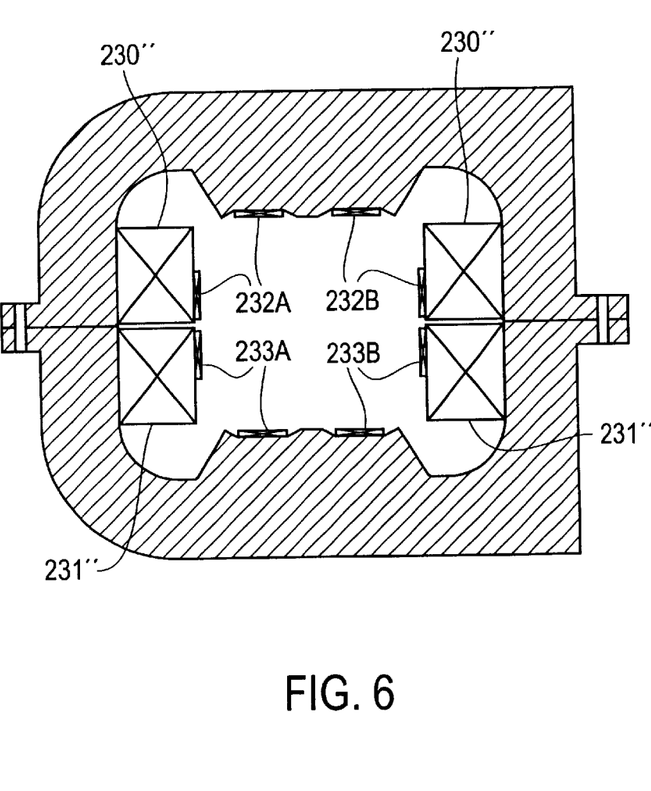
FIG. 6 is a cross-sectional view of the magnet system of a third embodiment of the invention.

FIG. 6 is a cross-section of a third embodiment of the magnet system of the invention. Each pole face 216", 226" has an elevated portion that has at least two grooves 218A, 218B; 228A, 228B. In this embodiment, two pairs of secondary magnet coils are used 232A, 232B; 233A, 233B. A first portion of each secondary magnet coil is inset in one groove on the pole face, and a second portion is mounted on the surface of the portion of the primary dipole magnet coil 230", 231" located on the nearer inner sidewall. It is also possible to sequence the secondary magnet coils along the beam path such that a plurality of individual coils is essentially equivalent to the length of a single coil depicted in the preferred embodiment. The pole face structure can also be made removable so that various pole shapes can be exchanged relatively easily and inexpensively.

Figure 7:
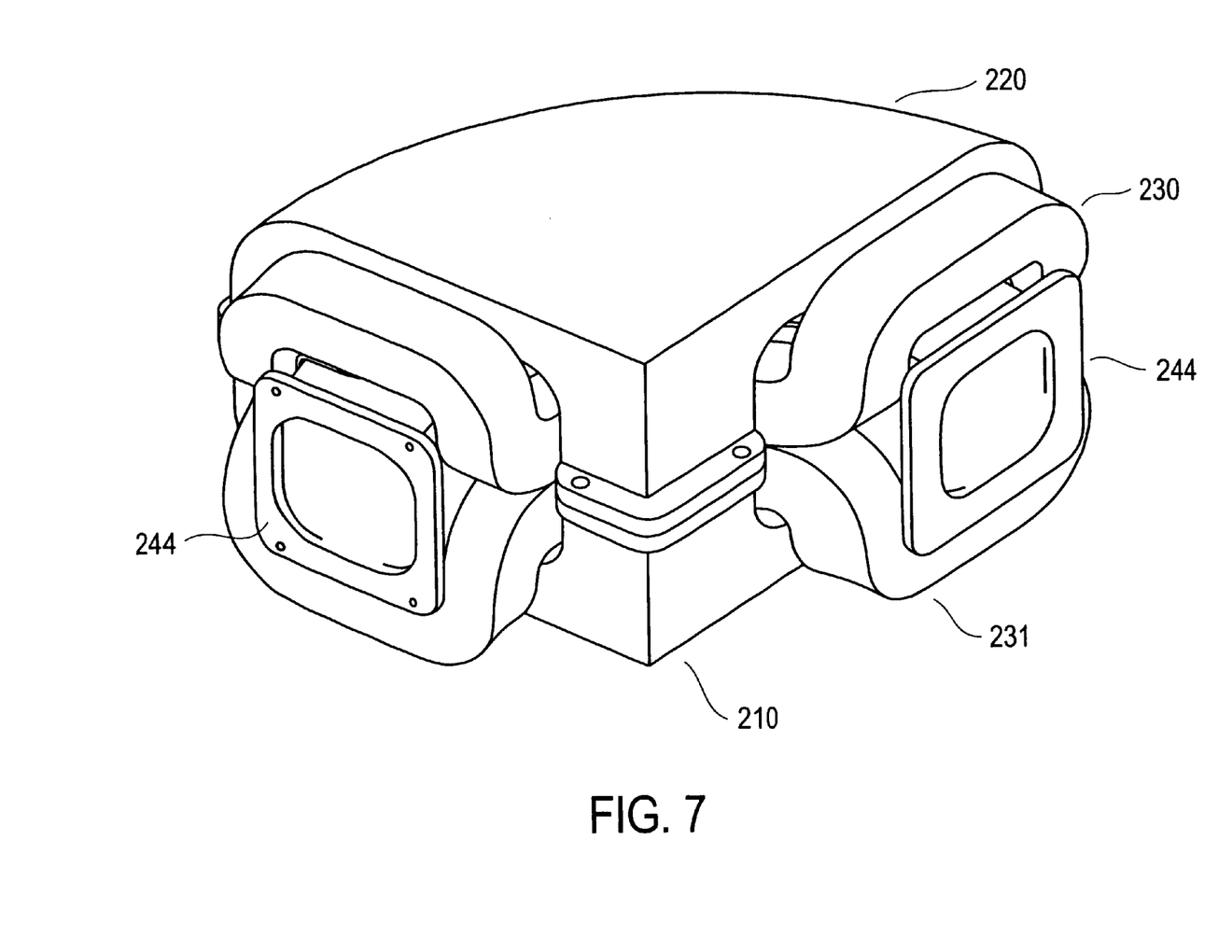
FIG. 7 is a perspective of the magnet system of the invention with a beamguide.

The magnet system of the invention also includes a beamguide 244 shown in FIG. 7. The beamguide has a rectangular cross section and is mounted in the magnetic field region surrounded by the magnet coils and the two pole faces. The beamguide extends through the complete arcuate sector from the entrance to the exit of the magnet system. The beamguide is made of a material with low magnetic permeability such as aluminum so that the applied magnetic field readily passes through it. The interaction of the magnetic field generated by the magnet coils with moving ions of the ion beams causes the ions to deflect in the dispersive plane in arcuate paths whose radii depend on the ion energy, mass, and charge or ionization state. Through this interaction or force, known commonly as the magnetic component of the Lorentz force, ions of different mass-to-charge ratios are separated resulting in several major ion beam trajectories, most of which strike the beamguide or resolving apertures and thus are unable to readily reach the work piece. A selected beam trajectory or, in other words, a given ion may be selected within the resolution capability of the system.

Figure 8:
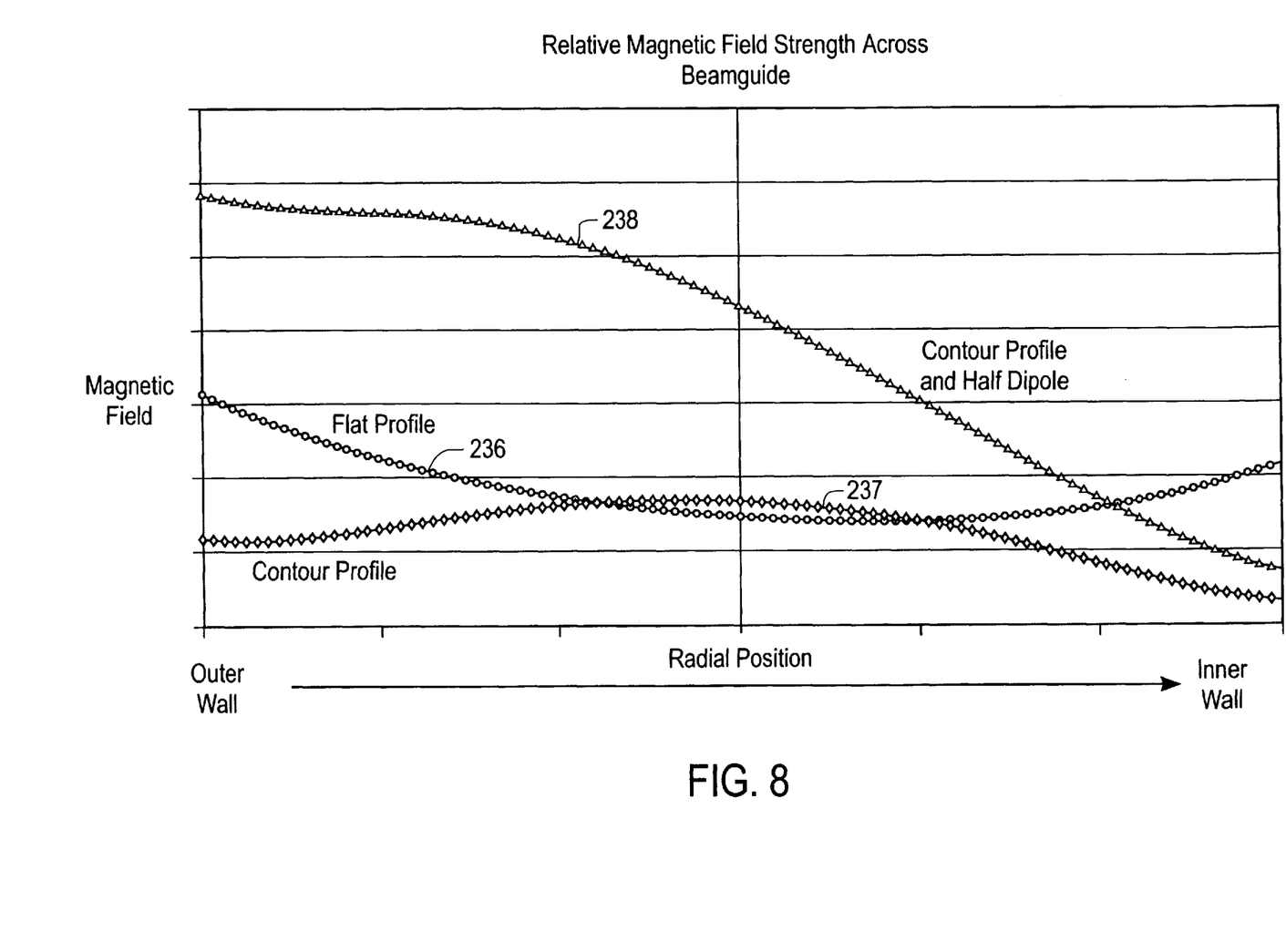
FIG. 8 depicts a comparison of cross-sectional (transverse) distribution of magnetic fields for different system configurations.

The use of the contour shape pole faces and the secondary magnet coils in the magnet system of the invention produces a magnetic field distribution that offsets the transverse space-charge induced blow-up of high perveance beams. FIG. 8 depicts the relative magnetic field strength in the beamguide as a function of radial position from the center of the magnet system for three different configurations. Note that the same primary dipole magnet coils are used in all three cases. In a first case of the flat pole face and no use of secondary magnet coils, the field strength 236 tends to peak near outer edges of the field region. With pole face contours as shown in FIG. 4 but without the secondary magnet coils, the resulting field distribution 237 in a second case shows a relative maximum at the central position or center of the beamguide. However, when the secondary magnet coils are energized in the magnet system with pole face contours as shown in FIG. 4, a gradient 238 in the magnetic field is established such that the field is stronger at the outer wall compared to the inner wall. That is, the resulting magnetic field across the beam cross-section has a sloping shape (i.e., gradient) with relative maxima and minima near the transverse beamline boundary. This magnetic field gradient achieved by the magnet system of the invention focuses the ion beam. The action of the magnetic field distribution on the ion beam acts to compensate the space-charge induced blow-up of high perveance beams.

FIG. 9 shows a plan view of three trajectories of ion beams to demonstrate effects due to the change of the magnetic field distribution achieved by this invention. The ion beams emanate from a point source 139 of the ion beam source, enter the magnet system at entrance point 240, and leave the magnet system at exit point 241. Because the same primary dipole magnet coils are used in both cases, the central trajectory of the ion beams follows the same path. The trajectories shown in solid lines give a focal point at position 242 that is obtained by using contour shape pole faces as shown in FIG. 4 without the secondary magnet coils. Focal point 243 is obtained when both the contour shape pole faces and the secondary magnet coils are used to produce a magnetic field distribution with a strong gradient 238. Clearly the focal point distance for the first case is larger than that of the second case and is indicative of one of the significant advantages of this magnet system over prior art. The combination of pole rotations, pole face contouring, and the secondary magnet coils compensate the field aberrations inherent in primary dipole magnet systems and provide optimal acceptance and dynamic focusing capability with relatively few components and controllers.

The method and apparatus of ion implantation of this invention produces superior ion beam current performance for high perveance beams by maximizing the magnet acceptance, adjusting the focal point distance, and minimizing ion losses by minimizing aberration. Use of the contour shape pole face in combination with the secondary magnet coils to improve the conventional dipole magnet performance for ion beam transport enhancement is an advancement over the prior art in the field of ion implantation.

It is understood that various other modifications will be readily apparent to those skilled in the art without departing from the scope and spirit of the invention. Accordingly, it is not intended that the scope of the claims appended hereto be limited to the description set forth herein, but rather that the claims be construed as encompassing all the features of the patentable novelty that reside in the present invention, including all features that would be treated as equivalents thereof by those skilled in the art to which this invention pertains.

What is claimed is:

1. A magnet system used in an ion beam implantation system, said magnet system comprising:
   a ferromagnetic assembly defining a magnetic field region therein and having an entrance and an exit for an ion beam that passes through said magnetic field region;
   at least one primary magnet coil mounted inside said assembly for generating a first magnetic field in a first direction in said magnetic field region; and
   at least one secondary magnet coil mounted inside said assembly for generating a second magnetic field in a second direction in said magnetic field region such that a resulting magnetic field has a gradient along one direction at said magnetic field region to enhance ion beam transport.

2. The magnet system according to claim 1, wherein said assembly has upper and lower yokes, each yoke having a first inner sidewall, a second inner sidewall opposed to said first inner sidewall, and an inwardly facing contour pole face located between said first and second inner sidewalls, and said pole faces of said upper and lower yokes are opposed to each other.

3. The magnet system according to claim 2, wherein first and second primary magnet coils are mounted on said inner sidewalls of said upper and lower yokes respectively.

4. The magnet system according to claim 3, wherein said first direction is between said pole faces of said upper and lower yokes.

5. The magnet system according to claim 3, wherein first and second secondary magnet coils have their respective first portions mounted on said pole faces of said upper and lower yokes.

6. The magnet system according to claim 5, wherein said second direction is between said first and second inner sidewalls.

7. The magnet system according to claim 6, wherein said gradient of said resulting magnetic field is in a direction across said first and second inner sidewalls.

8. The magnet system according to claim 5, wherein said first and second secondary magnet coils have their respective second portions mounted on portions of said first and second primary magnet coils located on said first inner sidewalls.

9. The magnet system according to claim 5, wherein said first and second secondary magnet coils have their respective second portions mounted on portions of said first and second primary magnet coils located on said second inner sidewalls.

10. The magnet system according to claim 3, wherein each pole face has a convex shape protruding towards said magnetic field region.

11. The magnet system according to claim 10, wherein said convex shape has a groove at the center thereof.

12. The magnet system according to claim 11, wherein said first and second secondary magnet coils have their respective first portions mounted in said grooves of said upper and lower yokes.

13. The magnet system according to claim 12, wherein said first and second secondary magnet coils have their respective second portions mounted on portions of said first and second primary magnet coils located on said first inner sidewalls.

14. The magnet system according to claim 12, wherein said first and second secondary magnet coils have their respective second portions mounted on portions of said first and second primary magnet coils located on said second inner sidewalls.

15. The magnet system according to claim 3, wherein each pole face has an elevated portion having at least one groove thereon.

16. The magnet system according to claim 15, further comprising third and fourth secondary magnet coils, wherein said elevated portion has two grooves adjacent to each other, and each of said secondary magnet coils has its first portion mounted in one of said grooves.

17. The magnet system according to claim 16, wherein each of said secondary magnet coils has its second portion mounted on a portion of the primary magnet coil located on said inner sidewalls.

18. The magnet system according to claim 2, wherein said pole face comprises interchangeable pieces for adjusting the shape and strength of said magnetic field in said magnetic field region.

19. A magnet system used in an ion beam implantation system, said magnet system comprising:
   a ferromagnetic assembly defining an arcuate magnetic field region therein and having an entrance and an exit for an ion beam that passes through said magnetic field region;
   at least one primary magnet coil mounted inside said assembly for generating a first magnetic field in a first direction in said magnetic field region; and
   at least one secondary magnet coil mounted inside said assembly for generating a second magnetic field in a second direction in said magnetic field region such that a resulting magnetic field has a gradient along one direction at said magnetic field region to enhance ion beam transport.

20. A magnet system used in an ion beam implantation system, said magnet system comprising
   a ferromagnetic assembly defining a magnetic field region therein and having an entrance and an exit for an ion beam that passes through said magnetic field region;
   at least one primary magnet coil mounted inside said assembly for generating a first magnetic field in a first direction in said magnetic field region substantially perpendicular to said ion beam; and
   at least one secondary magnet coil mounted inside said assembly for generating a second magnetic field in a second direction in said magnetic field region such that a resulting magnetic field has a gradient along one direction at said magnetic field region to enhance ion beam transport.

* * * * *